United States Patent [19]
Whitley

[11] Patent Number: 4,569,127
[45] Date of Patent: Feb. 11, 1986

[54] APPARATUS FOR SECURING A COMPONENT TO A PRINTED CIRCUIT BOARD

[75] Inventor: George J. Whitley, Philadelphia, Pa.

[73] Assignee: RCA Corporation, Princeton, N.J.

[21] Appl. No.: 688,997

[22] Filed: Jan. 4, 1985

[51] Int. Cl.<sup>4</sup> .............................................. H05K 3/30
[52] U.S. Cl. ........................................ 29/741; 140/105
[58] Field of Search .................... 29/741, 566.3, 33 F, 29/835, 838, 839; 140/105

[56] References Cited

U.S. PATENT DOCUMENTS

| | | | |
|---|---|---|---|
| 3,147,779 | 9/1964 | Brown | 140/105 X |
| 3,439,402 | 4/1969 | Chin et al. | 29/203 |
| 3,592,375 | 7/1971 | Zemek et al. | 227/87 |
| 4,108,217 | 8/1978 | Westberg, II | 140/105 |
| 4,377,026 | 3/1983 | Whitley | 29/564.1 |
| 4,462,435 | 7/1984 | Whitley | 140/105 |
| 4,464,829 | 8/1984 | Whitley et al. | 29/741 |
| 4,520,549 | 6/1985 | Whitley et al. | 140/105 X |

Primary Examiner—Carl E. Hall
Attorney, Agent, or Firm—Joseph S. Tripoli; George E. Haas; William Squire

[57] ABSTRACT

A set of lead bending fingers are spaced to receive an array of transistor leads adjacent their respective bending surfaces. In the bend mode, the fingers are driven toward each other in close interdigitated relation for bending closely-spaced leads. A spiral cam drive member simultaneously drives the bending fingers in a single rotary motion of the drive member.

13 Claims, 10 Drawing Figures

APPARATUS FOR SECURING A COMPONENT TO A PRINTED CIRCUIT BOARD

This invention relates to apparatus for bending the leads of a component on a printed circuit board for securing the component to the board.

Of interest are the following pending U.S. Patent Applications: "Component Lead Processing Apparatus," Ser. No. 589,330, filed Mar. 14, 1984 by George J. Whitley, the present inventor; "Multiple Component Lead Processing Apparatus," Ser. No. 363,960, filed Mar. 31, 1982, by George J. Whitley et al.; "Component Lead Processing Device, "Ser. No. 531,242, filed Sept. 12, 1983, by Wojciech Starski; "Component Lead Processing Apparatus," Ser. No. 558,367, filed Dec. 5, 1983 by Wojciech Starski; and "Component Lead Processing Device," Ser. No. 302,294, filed Sept. 14, 1981, by George J. Whitley et al., all of the above-mentioned applications being assigned to the assignee of the present invention.

Printed circuit board assemblies comprise printed circuit board substrates to which are secured electrical components such as transistors, resistors, capacitors, and so forth. The components have leads which are to be electrically connected to selected conductors on a printed circuit board for completing a circuit. Some components, such as transistors, have leads which are usually employed to secure the transistor to the printed circuit board and which can electrically connect the component to the printed circuit board conductors. Thus, the leads serve a dual purpose in electrically connecting the component to the conductors and for mechanically securing the component to the board.

The process of assembling components to a printed circuit board includes the initial step of securing the component to the board by inserting the leads through holes in the board substrate. The board is then conveyed to a wave soldering apparatus for soldering the component leads to the conductors on the printed circuit board. The components, while being conveyed, tend to fall from the board and therefore, the leads are bent to secure the components to the boards prior to application of the solder. With respect to component leads such as resistors, transistors, and the like, apparatus for bending the leads to secure the component to the boards are known.

By way of example, reference is made to my recently-issued U.S. Pat. No. 4,462,435. Disclosed therein is a component element bending apparatus which includes a pair of bending jaws which are radially displaced by spiral and radially extending camming slots in adjacent respective rotatable drive and stationary discs when the rotatable drive disc is activated. The rotatable disc is driven by a drive lever coupled to an air-operated drive. The bending jaws bend the flat sheet metal leads of a transformer. Spiral slots are rotated to cause the jaw members to linearly displace toward each other. The jaws push against the leads bending them against a surface of the printed circuit board. As disclosed, the transformer assembly leads, as well as the leads of most conventional components, are generally widely spaced, e.g., on 0.100 inch centers at a minimum, which provides sufficient room for the jaws to bend the different leads without mutual interference.

As sometimes occurs, component leads are closely spaced to one another. By way of example, in some transistors, the leads may be spaced apart on 0.050 inch centers. Apparatus is disclosed in application Ser. No. 302,294, filed Sept. 14, 1981, mentioned above, for bending closely spaced leads. As described therein in more detail, prior art component lead bending devices, e.g., as disclosed in U.S. Pat. No. 4,377,026, tend to be relatively bulky, limiting the spacing of adjacent component lead processing devices. Other component lead processing mechanisms are described in that patent which lists a number of U.S. patents disclosing such mechanisms. As mentioned in application Ser. No. 302,294, prior systems for processing leads of closely spaced components require the processing devices to be duplicated downstream in an assembly line. One set of component lead processing devices operate on widely spaced component leads and a second downstream set of further component lead devices process the leads of components adjacent to the previous processed components.

Further, as disclosed in FIG. 7 of application Ser. No. 302,294, an array of lead processing devices is shown in contiguous relation in order to process the leads of multiple closely-spaced components. That system can process numerous closely-spaced leads of components placed in closely-spaced arrays. However, there exist specific situations to which that system is not readily adapted.

By way of example, the processing heads disclosed therein each have a central shaft region not adapted to process a component lead. The component processing head comprises a pair of lead processing surfaces which extend radially from that central shaft region. While each lead processing portion of the processing head may be made sufficiently large to receive closely-spaced leads, components having closely-spaced leads which need to be bent in different directions cannot be spaced closer than the spacing of the oppositely disposed radial portions due to the presence of that central shaft. In that case, as disclosed, a number of processing heads are placed contiguous in an array. However, some components such as certain transistors, may have lead configurations which cannot be easily processed by that structure.

One such transistor includes three leads linearly aligned in closely spaced relationship, for example, on 0.050 inch centers. Further, it sometimes occurs that such transistors are employed in high-frequency circuits in which the presence of excess lead lengths may cause undesirable RF (radio frequency) interference. In these kinds of circuits, it is critically important that the transistor leads be as short as possible.

With such transistors, prior to the insertion into the printed circuit board, the two outer leads have dog leg shaped bends extending in opposite directions and the central lead is normally unbent so as to space the three leads on 0.100 inch centers. This 0.100 inch spacing provides sufficient room for prior art lead processing devices to bend those outer transistor leads against the board. The dog leg shaped bends cause the transistor body to be spaced from and a portion of each of the leads to extend above the printed circuit board. This elevation of the transistor body can present undesired electrical RF problems in the associated circuit.

Also, it is not desirable that adjacent closely-spaced leads be bent in the same direction. Due to the 0.050 inch spacing it is likely that those adjacent leads and their printed circuit board contact pads may be too closely spaced and give rise to undesired short circuits. For example, the contact pads on the printed circuit board should be sufficiently spaced apart to preclude creating solder bridges arising from the wave soldering process.

An apparatus according to the present invention for securing a component to a printed circuit board in which the component has at least three leads aligned in a linear array includes a first component lead bending member which includes at least one lead bending finger adapted for bending the central lead of the array. A second component lead bending member includes a pair of spaced lead bending fingers adapted for bending the pair of leads adjacent to the central lead. The space between the pair of fingers is dimensioned to receive the one finger therein. The fingers each have a lead bending surface for bending a corresponding lead.

Means coupled to the bending members move the members from a first spaced apart position for receiving the leads therebetween to a second position where the finger of the first bending member is interdigitated with the pair of fingers of the second bending member to bend the corresponding leads. The means return the interdigitated bending members to the first position.

Figure 1:
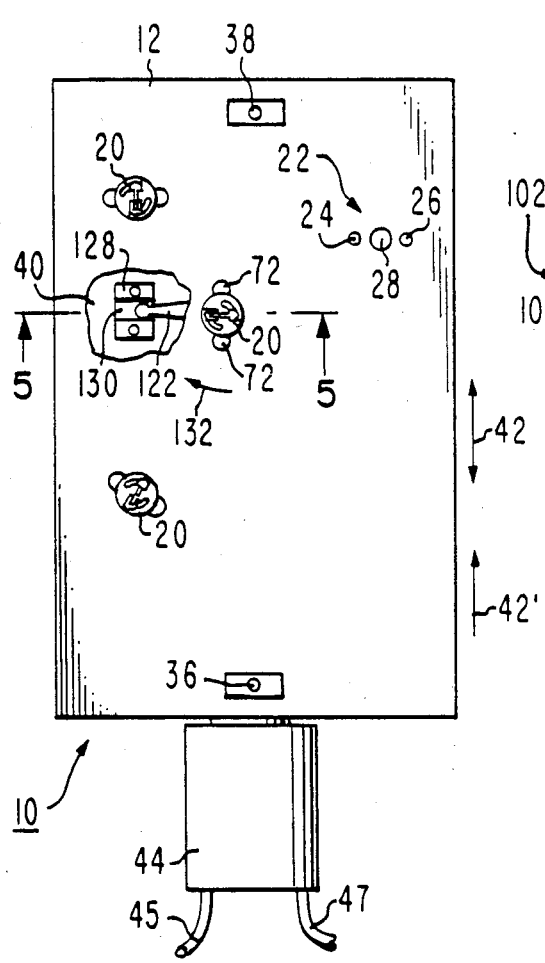
FIGS. 1 and 2 are plan and elevation views, respectively, of a component lead bending apparatus in accordance with one embodiment of the invention.
Figure 2:
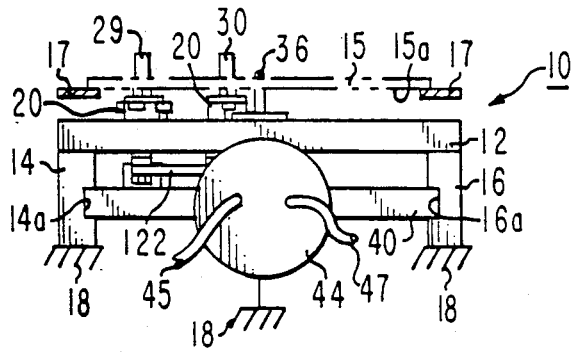

In FIGS. 1 and 2, a component lead bending system 10 includes a support structure comprising a plate 12 and a pair of frame members 14 and 16 to which the plate 12 is secured. Plate 12 is shown partially broken away in FIG. 1 to illustrate details to be hereinafter described. As represented by the symbols 18, FIG. 2, the frame members 14 and 16 are secured to stationary structural members (not shown) such as a conveyor supporting structure in a factory assembly line. At least one, but typically a plurality of component lead bending assemblies 20 to be described in more detail hereinafter in connection with the description of FIGS. 3-7 are secured to plate 12. Three such bending assemblies 20 are shown in FIG. 1. A printed circuit board 15, FIG. 2 (shown in phantom), is conveyed over the apparatus 10, plate 12 by a conveyor 17 which may comprise a pair of parallel conveying belts supported by the conveyor supporting structure, symbols 18.

In region 22 of plate 12, FIG. 1, are apertures in the plate for accepting a fourth component lead bending assembly. Apertures 24 and 26 are threaded to accept screws, for example, screws 72, to secure a bending assembly 20 to plate 12. A portion of a bending assembly 20 when installed, extends through center aperture 28. Apertures similar to apertures 24, 26, and 28 are located in plate 12 for each bending assembly 20.

The bending assemblies 20 are positioned on plate 12 at locations corresponding to the location of components on printed circuit board 15, FIG. 2, whose wire leads are to be bent for securing the component to the printed circuit board. For example, components 29 and 30, FIG. 2, are placed directly above two of the bending assemblies 20, FIG. 1. The printed circuit board 15, FIG. 2, is positioned relative to plate 12 by locating pins 36 and 38, FIG. 1, which are secured to plate 12. Printed circuit board 15 has locating apertures (not shown) which mate with pins 36 and 38 for locating board 15 relative to assemblies 20. One example of structure for so aligning the printed circuit board is described in more detail in U.S. Pat. No. 4,377,026.

Movable plate 40, FIG. 2, slides in frames 14 and 16 respective guide slots 14a and 16a parallel to and spaced from plate 12. Motion of plate 40 is in directions 42, FIG. 1, parallel to the plane of plates 12 and 40. Air cylinder 44, FIG. 2, is mechanically secured to the structure to which frames 14 and 16 are secured and moves plate 40 via mechanical linkage (not shown). Air cylinder 44 operates in response to pressurized air supplied in one or the other of hoses 45 and 47. Other power devices may be employed in the alternative to cylinder 44. Plate 40 imparts simultaneous rotary motion through a portion of each of the assemblies 20 to activate the lead bending process as will be described below in more detail.

Figure 8:
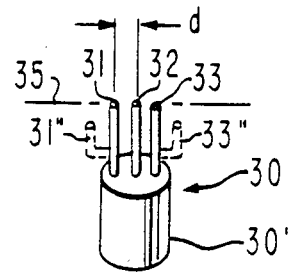
FIG. 8 is an isometric view of a transistor component to be processed by the one embodiment of the present invention.

In FIG. 8, component 30, which may be a transistor comprises a circular cylindrical body 30' and a linear array of leads 31, 32, and 33 projecting from the body and lying on line 35. Component 30 of FIG. 8 is inverted from its orientation of FIGS. 2 and 5. The center-to-center spacing of adjacent ones of the leads, for example the center-to-center spacing between leads 31 and 32, distance d, is less than the typical 0.100 inch spacing normally used for most printed circuit board component leads, and may be, for example, 0.050 inch. Leads 32 and 33 are also spaced distance d.

Figure 7:
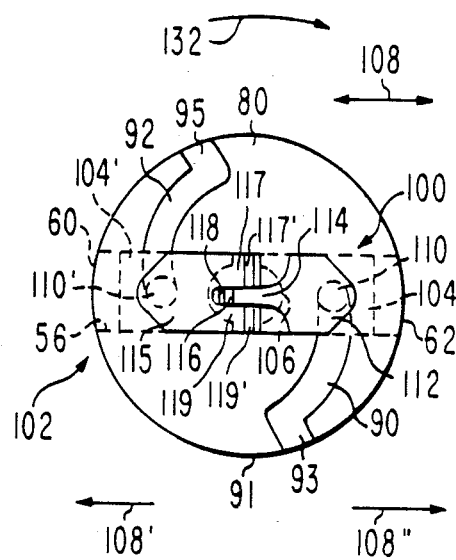
FIG. 7 is a plan view of the bending assembly of FIG. 4 illustrating a later stage of the component lead bending process.

In the prior art, to attach a component such as component 30 to a printed circuit board, the leads 31 and 33 are bent apart similar to the leads of transistor 142, U.S. Pat. No. 4,377,026, FIG. 7, and as shown in phantom in FIG. 8 herein at 31" and 33", respectively. The transistor body 30', FIG. 8 herein, tends to be spaced from the mating printed circuit board when the leads are bent as shown in FIG. 7 of U.S. Pat. No 4,377,026. This spacing tends to increase the lead lengths undesirably in RF circuits as mentioned previously in the introductory portion.

Figure 9A:
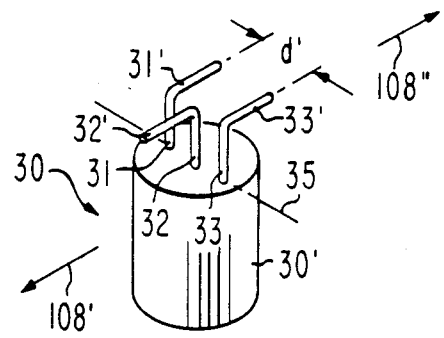
FIG. 9a is an isometric view of the component of FIG. 8 after processing.
Figure 9B:
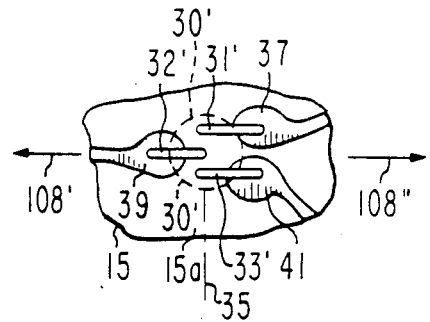
FIG. 9b is an underside view of a printed circuit board with the component of FIG. 8 attached by the apparatus constructed according to the present invention.

The lead bending apparatus described below bends the leads 31-33 of transistor 30, FIG. 8, so that the leads need not be bent as shown at 31" and 33", FIG. 8, but are bent as shown in FIGS. 9a and 9b after insertion into the circuit board apertures. When so bent, the leads, FIG. 9b, conductively engage the mating printed circuit board 15 contact pads such as pads 37, 39, and 41, respectively. Leads 31, 32 and 33, when bent, have respective bent-over portions 31', 32', and 33'. The lead portions 31' and 33' are bent in the same relative direction 108" away from line 35. This spaces portions 31' and 33' about 0.100 inch apart distance d', FIG. 9a, permitting safe spacing of the printed circuit board contact pads 37 and 41, FIG. 9b. The lead portion 32' is bent in the opposite direction 108' away from line 35, permitting the pad 39 to be safely spaced from the pads 37 and 41. Further, the component body 30', FIG. 8, is secured abutting printed circuit board 15, FIGS. 2 and 5, reducing the lead lengths to a minimum, minimizing RF interference which might otherwise occur. No known prior art lead processing apparatus can bend such closely-spaced leads simultaneously to the bent condition of FIG. 9a.

Figure 4:
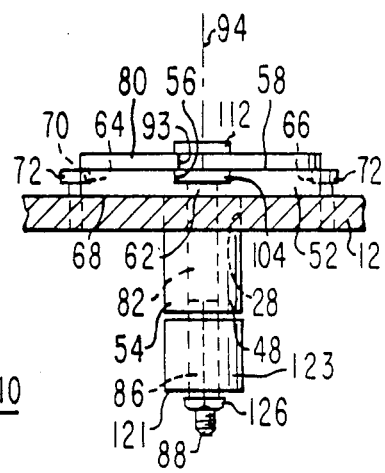
FIG. 4 is a side elevation view of the lead bending assembly of FIG. 3 taken along lines 4—4.
Figure 5:
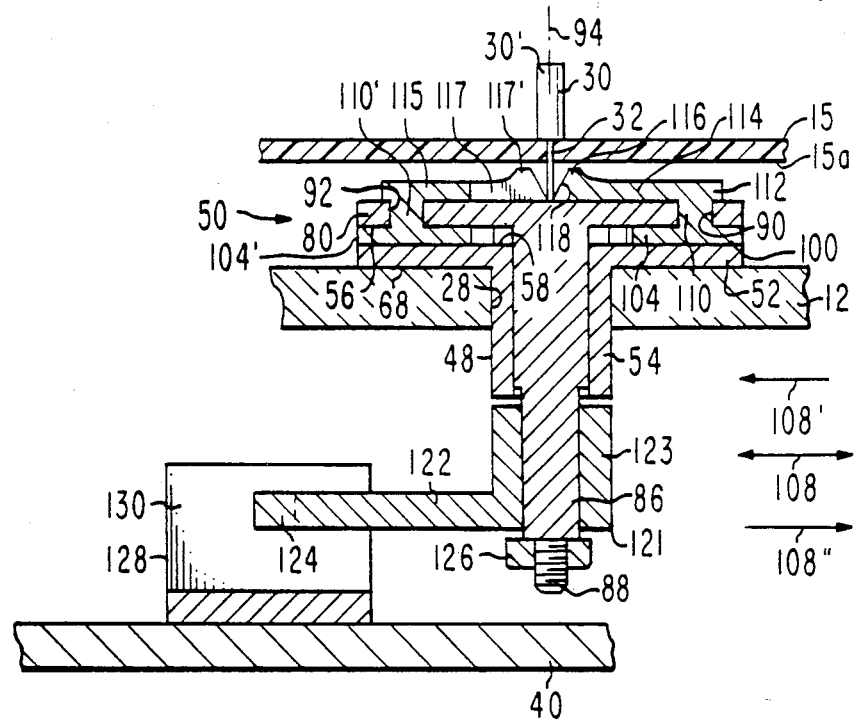
FIG. 5 is a sectional view taken along lines 5—5 of FIG. 1 illustrating one embodiment of a component lead bending apparatus further including a printed circuit board assembly.
Figure 6:
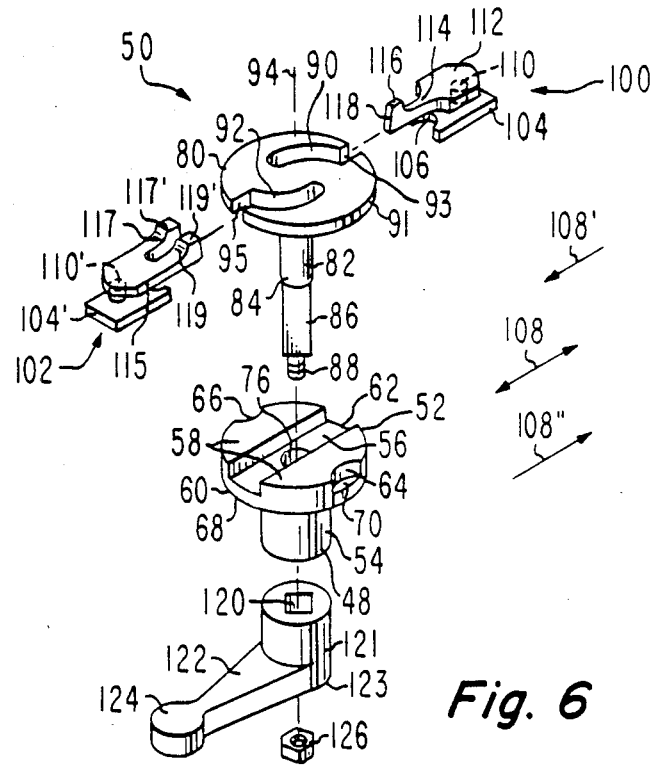
FIG. 6 is an exploded view of the bending assembly of FIG. 4.

In FIGS. 4–6, bending assembly 20 comprises a stationary member 48 and a movable assembly 50. The stationary member 48 includes a head 52 and a shaft 54. The head 52 comprises a disc-like member having a centrally positioned slot 56 extending across the head upper surface 58 from edge 60 to edge 62. A pair of semicircular grooves 64 and 66, FIG. 6, are on diametrically opposite sides of the head 52 extending partially from the upper surfaces 58 toward the lower surface 68. The grooves 64 and 66 each have a shoulder 70 by which the stationary member 48 can be secured to plate 12 by screws 72, FIG. 4, via threaded apertures 24 and 26, FIG. 1. Shaft 54 is a hollow circular cylinder depending from head 52. Shaft 54 has a circular cylindrical opening 76, FIG. 6, which passes centrally through shaft 54 and 52, terminating centrally in slot 56. In FIG. 5, shaft 54 depends below plate 12 and the head 52 surface 68 abuts the upper surface of plate 12.

Movable assembly 50, FIG. 6, includes a rotatable disc-like camming member 80 from which depends shaft 82. Shaft 82 includes an upper circular cylindrical portion 84 and a lower portion drive element 86 having a square transverse section and from which depends a threaded stud 88. Camming member 80 has two spiral slots 90 and 92 which may be of identical dimensions and which spiral radially away from axis 94 in the same angular direction and to the same radial extent in a given angular increment. That is, slots 90 and 92 spiral similarly relative to axis 94. Slot 90 is in communication with the member 80 peripheral edge 91 via slot portion 93, FIG. 7, which is parallel to and spaced from a diametrical line passing through axis 94. Slot 92 is in communication with member 80 edge 91 via slot portion 95 which is parallel to and spaced about the same distance as slot 93 from and on the opposite side of that diametrical line. Shaft 82 portion 84, FIG. 6, is closely received in opening 76 and rotates about axis 94. With shaft 82 so received, drive element 86 depends below shaft 54, FIG. 4. Disc-like member 80 thus rotates about axis 94 in response to the rotation of element 86.

Movable assembly 50, FIG. 6, also includes two lead bending members 100 and 102. Member 100 comprises a base plate 104 having a semicircular opening 106. Plate 104 is closely received in slot 56 of member 80 so that the member 100 can reciprocate in directions 108, along a diametrical line passing through axis 94. Opening 106 faces shaft 82 and permits member 100 to move to its extreme left-most lead bending position in direction 108' embracing cylindrical portion 84.

Upstanding from plate 104 is a circular cylindrical cam 110 which is located in and slides in spiral slot 90. In FIG. 7, cam 110 is closely received in slot 90 abutting both side walls thereof so as to follow the spiral path of the slot 90 as the member 80 is rotated about axis 94 in either of two opposite angular directions. As that spiral path passes over slot 56 the cam 110 is displaced radially along slot 56 by member 80 as member 80 rotates.

Secured to the upper end of cam 110 opposite plate 104 is lead bending element 112, FIG. 5. Element 112 includes a cantilevered finger 114 which extends radially inwardly from cam 110 toward axis 94, FIGS. 3 and 7. Finger 114 includes an upstanding nose 116 which projects from the plane of the body portion of finger 114, FIG. 5, and which is spaced from lower surface 15a of printed circuit board 15 when the assembly 20 is in the lead processing position. The finger 114 tip including nose 116 has a tapered bending surface 118 which faces axis 94.

Finger 114 passes through axis 94 in direction 108', FIG. 7, in response to the rotary motion of member 80 in angular direction 132. Finger tip surface 118, FIG. 5, engages and bends the protruding portion 32' of the central component lead 32, FIGS. 9a and 9b, against the printed circuit board 15 surface 15a. The cam 110 being a circular cylinder smoothly follows the path of the spiral slot 90 as the slot 90 rotates in direction 132 relative to slot 56 in response to rotation of the shaft 82, FIG. 4, about axis 94.

The other bending member 102 has a base plate 104' dimensioned similarly as plate 104 and is also closely received in slot 56 and reciprocates in slot 56 in directions 108. Plate 104 of jaw member 100 and plate 104' of member 102 are between disc-like member 80 and the bottom surface of groove 56, FIG. 5. Upstanding from plate 104' is circular cylindrical cam 110' which slides in the spiral slot 92. In FIG. 5, the cam 110' is closely received in slot 92 abutting both side walls thereof so as to follow the path of that slot as the disc member 80 is rotated about axis 94. Secured to the upper end of cam 110' is lead bending element 115.

Element 115 has a pair of spaced apart fingers 117 and 119, FIGS. 6 and 7. The fingers 117 and 119 are cantilevered and extend radially inwardly from cam 110' and tend to straddle axis 94 so that the space between the fingers 117 and 119 lies on a diametrical line which passes through axis 94. Fingers 117 and 119 are spaced so that the finger 114 of element 112 slidably engages or is closely spaced to the inner facing surfaces of the fingers 117 and 119 when the elements 115 and 112 approach each other in respective opposite directions 108" and 108', FIGS. 3 and 7. Thus, finger 114, moves in opposite directions as, and is interdigitated with, fingers 117 and 119 when the bending members 100 and 102 are moved from the initial position of FIG. 3 to the final lead bending position of FIG. 7.

Figure 3:
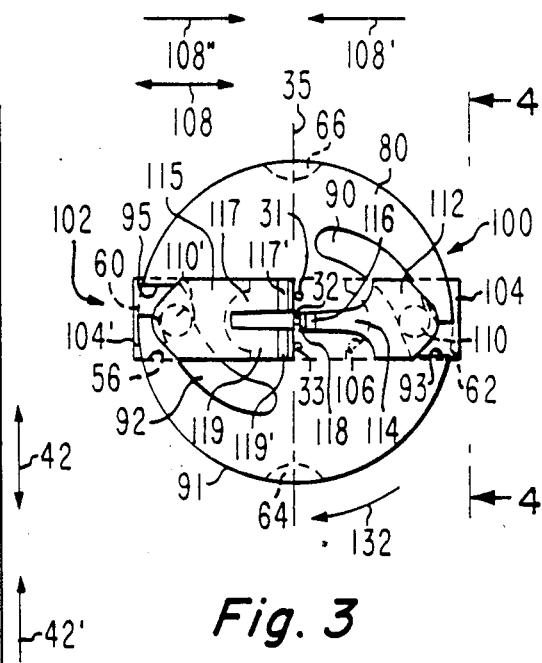
FIG. 3 is a plan view of a component lead bending assembly portion of the apparatus of FIG. 1.

Fingers 117 and 119 each include a respective nose 117' and 119' corresponding to and shaped similarly as nose 116 of finger 114. The fingers 117 and 119 have tapered bending surfaces similar to bending surface 118 of finger 114 and which taper radially away from the line 35 of the component leads, FIG. 3, and toward printed circuit board 15, FIG. 5. In FIG. 3, finger 114 bending surface 118 is aligned with and faces lead 32, the finger 117 bending surface is aligned with and faces lead 31 and the finger 119 bending surface is aligned with and faces lead 33.

Element 112, cam 110 and finger 114 form an integral assembly too large to pass through slot 90 in a direction normal to the broad surface of member 80. Therefore, to assemble member 100 to member 80, cam 110 is passed into slot 90 through slot portion 93 in a direction parallel to the plane of member 80. The other bending member 102 is assembled similarly via slot portion 95. With the bending members so placed, the disc-like camming member 80, FIG. 5, is captivated between the jaws and the base plates of the bending members 100 and 102.

Drive member 121, FIG. 6, includes a cylindrical portion 123 having a square opening 120 which closely receives drive element 86 of shaft 82. Drive lever 122 extends from the cylindrical portion 121 and includes semicircular cylindrical camming end 124. Nut 126, FIG. 5, is threaded to stud 88 of shaft 82 securing drive member 121 to shaft 82. Lever 122 is parallel to and spaced from plate 40.

To assemble the above structures, the bending members 100 and 102 are first attached to the camming member 80. Head 52 is then secured to plate 12 by screws 72. Then shaft 82 is inserted into the opening 76 and base plates 104 and 104' inserted in slot 56. After shaft 82 is in opening 76, drive member 121 is secured to element 86 of shaft 82 by nut 126.

A slotted bracket 128, FIG. 1, is attached to plate 40. Bracket 128 has a slot 130 normal to directions 42 of movement of plate 40. Cam end 124 of lever 122 slides in slot 130. As plate 40 is moved back and forth in directions 42, FIG. 1, lever 122 is moved in directions 42, pivotting drive member 121 about axis 94, rotating member 80 relative to the stationary head 52. In the alternative, other operating mechanisms may be employed for rotating the member 80 relative to the stationary head 52. Typically, however, only one type will be used in a particular implementation for all of the bending assemblies 20, FIG. 1.

Bending assemblies 20, FIG. 1, are secured to plate 12 with the fingers of bending members 100 and 102 aligned with the anticipated orientation of the corresponding array of component leads of components 29, 30 and so forth on printed circuit board 15 as shown in FIG. 3. More particularly, the bending members 100 and 102 are aligned so that the leads 31, 32, and 33 to be bent are aligned with and are adjacent to the respective facing tapered end surfaces of fingers 114, 117, and 119. The bending members 100 and 102 can have any desired orientation relative to directions 42, FIG. 1. This is because drive member 121 will always rotate member 80 the desired amount regardless the relative angular orientation of the spiral slots to directions 42.

In FIG. 3, assuming the component is placed with its leads spaced relative to the bending fingers as shown in FIG. 3, by structure similar to that described in U.S. Pat. No. 4,377,026, the air cylinder 44, FIG. 2, moves plate 40 in one of directions 42. With an assembly 20 oriented as shown in FIG. 3, the plate 40 moves in direction 42', FIG. 1. This rotates member 80 clockwise in direction 132, FIG. 3, about axis 94. Rotation of the member 80 in direction 132 rotates the spiral slots 90 and 92 such that the slot portions overlying slot 56 radially approach axis 94 as the slots 90 and 92 pass over slot 56. This action forces members 100 and 102 linearly inwardly in slot 56 toward each other in respective directions 108' and 108". The tapered bending tip surfaces of the fingers engage the mating leads adjacent thereto and bends those lead portions, which are protruding from the undersurface of printed circuit board 15, FIG. 5, against printed circuit 15 undersurface 15a, FIG. 2. The leads are bent simultaneously to the condition of FIGS. 9a and 9b.

As the bending members 100 and 102 move toward their inward-most position, FIG. 7, the upper surfaces of the respective noses of the different fingers force the corresponding leads against the printed circuit board undersurface 15a, firmly securing the leads and the component 30 to the printed circuit board. The upper surfaces of the noses facing the undersurface of the printed circuit board 15 are spaced therefrom an amount sufficient to permit the leads to be bent therebetween. After the leads are bent, the air cylinder 44, FIG. 1, immediately returns the fingers to their initial starting position, FIG. 3, by returning the drive member 121, FIG. 5, to its beginning position, and thus rapidly returns the members 100 and 102 to their initial position, FIG. 3, in a successive time interval. In the initial position, the slot portions 93 and 95 are offset from the diametrical line passing through cams 110 and 110' an amount sufficient to prevent the bending members from sliding out of engagement with camming member 80 in directions 108.

What is claimed is:

1. Apparatus for securing a component to a printed circuit board, said component having at least three leads aligned in a linear array, said apparatus comprising:
   a first component lead bending member including at least one lead bending finger adapted for bending the central lead of said array;
   a second component lead bending member including a pair of spaced lead bending fingers adapted for bending the pair of leads adjacent the central lead, the space between said pair of fingers being dimensioned to receive said one finger therein, said fingers each having a lead bending surface for bending a corresponding lead; and
   means coupled to the bending members for moving the members from a first spaced apart position for receiving the leads therebetween to a second position where the finger of the first bending member is interdigitated with the pair of fingers of the second bending member to bend the corresponding leads, said means also for returning the interdigitated bending members to said first position.

2. The apparatus of claim 1 wherein said component lead bending members each include a plate portion, a cam portion and a lead bending portion including said one or pair of bending fingers; and
   said means for moving including rotatable spiral cam drive means coupled to said plate portions and cam portions to move said fingers in response to rotation of said spiral cam drive means.

3. The apparatus of claim 1 wherein each said finger lies in a plane and has a nose portion at the finger tip extending above the plane of that finger.

4. The apparatus of claim 1 wherein said means for moving include means for driving said fingers in linear opposite parallel directions in first and second successive time intervals.

5. In an apparatus for securing a component to a printed circuit board comprising:
   a support structure;
   at least one component lead bending assembly; and
   means secured to the support structure for aligning a printed circuit board relative to said bending assembly;
   said bending assembly comprising a stationary first member secured to the support structure and a second member rotatable about an axis relative to said first member, said first member having at least one radially extending slot extending in a given direction relative to said support structure and the second member having a pair of spirally extending slots each extending away from said axis and located diametrically opposite said axis, said spiral slots each overlying the radially extending slot, the improvement therein comprising:

a pair of component lead bending members each having a base portion in said radially extending slot, a camming portion in a different one of said spirally extending slots and a lead bending portion projecting from the corresponding spiral slot adjacent said printed circuit board, said component lead bending portions each comprising at least one bending finger, said fingers extending in opposite facing directions parallel to said given direction and are so positioned and adapted that upon relative rotation of said first and second members, said bending members are linearly displaced in said radially extending slot toward each other as the respective camming portion follows the corresponding spirally extending slots and the finger on the one member passes by in close spaced relation to the finger on the other member; and drive means coupled to said second member for rotating the second member relative to the first member about said axis.

6. The apparatus of claim 5 wherein said second member comprises a disc-like element having a peripheral edge, said spirally extending slots each extending in communication with said peripheral edge to permit said camming portion to be passed into a corresponding one of said spirally extending slots at said peripheral edge.

7. The apparatus of claim 5 wherein each said bending finger comprises a planar body portion and a bending nose portion extending from the plane of the body portion.

8. The apparatus of claim 5 wherein each said finger has a first surface in sliding engagement with a surface of the rotatable second member and a second surface spaced from the plane of said body portion forming a nose portion, each nose portion having an end surface tapering from the first surface toward its second surface in a direction away from the other lead bending member.

9. The apparatus of claim 5 wherein the finger of the one member is spaced relative to the other member finger so that the one member finger passes in sliding engagement with the other member finger.

10. The apparatus of claim 5 wherein said fingers have a first spaced part neutral position and a second lead engagement position upon rotation of the second member relative to the first member, said first neutral position being such that the finger tip end surfaces of each member lie on a line, the line of one member being spaced from a line passing through said axis a first distance, the line for the other member being spaced from said axis line a second distance.

11. The apparatus of claim 5 wherein one of said bending members includes a pair of bending fingers, the finger of the other member being positioned and dimensioned to closely pass between the pair of fingers upon rotation of said second member from a first spaced apart position to a second lead bending position.

12. The apparatus of claim 11 wherein said other member finger slidably engages each finger of said pair of fingers.

13. The apparatus of claim 5 wherein said first member comprises a body having a circular cylindrical opening extending between a pair of ends and a first disc-like element secured to one of said ends and having a radially extending slot extending edge to edge across said disc-like element, said second member comprises a shaft rotatably secured in said cylindrical opening for rotation about said axis parallel to the longitudinal axis of said cylindrical opening and a second disc-like element secured to one end of said shaft parallel to the first disc-like element, said second element having said spirally-extending slots on opposite sides of said axis, said bending member's base portions being between facing surfaces of said first and second disc-like elements, the camming portions being in a corresponding spirally-extending slot, and the bending portions being in sliding engagement with a surface of the second disc-like element.

* * * * *